(12) United States Patent
Richardson et al.

(10) Patent No.: US 7,898,001 B2
(45) Date of Patent: Mar. 1, 2011

(54) SINGLE PHOTON DETECTOR AND ASSOCIATED METHODS FOR MAKING THE SAME

(75) Inventors: Justin Richardson, Edinburgh (GB); Lindsay Grant, Edinburgh (GB); Marek Gersbach, Lausanne (CH); Edoardo Charbon, CD Delft (NL); Cristiano Niclass, Clarens (CH); Robert Henderson, Edinburgh (GB)

(73) Assignees: STMicroelectronics (Research & Development) Limited, Marlow-Buckinghamshire (GB); The University Court of the University of Edinburgh, Edinburgh (GB); Ecole Polytechnique Federale De Lausanne (CH)

( * ) Notice: Subject to any disclaimer, the term of this patent is extended or adjusted under 35 U.S.C. 154(b) by 0 days.

(21) Appl. No.: 12/327,240

(22) Filed: Dec. 3, 2008

(65) Prior Publication Data

US 2010/0133636 A1    Jun. 3, 2010

(51) Int. Cl.
  *H01L 31/0328* (2006.01)
(52) U.S. Cl. ............... 257/186; 257/170; 257/199; 257/484; 257/603; 257/E31.058
(58) Field of Classification Search ............... 257/80, 257/186, 199, 484, 170, 603
See application file for complete search history.

(56) References Cited

U.S. PATENT DOCUMENTS

| | | | |
|---|---|---|---|
| 2001/0017786 A1* | 8/2001 | Woodward | 365/120 |
| 2004/0056176 A1* | 3/2004 | Shizukuishi | 250/208.1 |
| 2006/0163627 A1* | 7/2006 | Mouli | 257/290 |
| 2006/0192086 A1* | 8/2006 | Niclass et al. | 250/214.1 |
| 2009/0065704 A1* | 3/2009 | Heringa et al. | 250/370.11 |
| 2010/0245809 A1* | 9/2010 | Andreou et al. | 356/222 |

OTHER PUBLICATIONS

Faramarzpour, Naser et al. *Fully Integrated Single Photon Avalanche Diode Detector in Standard CMOS 0.18- μm Technology*: IEEE Transactions on Electron Devices, vol. 55, No. 3, Mar. 2008; pp. 760-767.

Niclass, Cristiano et al *A Single Photon Avalanche Diode Implemented in 130-nm CMOS Technology*: IEEE Journal of Selected Topics in Quantum Electronics, vol. 13. No. 4, Jul./Aug. 2007; pp. 863-869.

Finkelstein, Hod et al *STI-Bounded Single-Photon Avalanche Diode in a Deep-Submicrometer CMOS Technology*: IEEE Electron Device Letters, vol. 27, No. 11, Nov. 2006; pp. 887-889.

(Continued)

*Primary Examiner*—Wai-Sing Louie
(74) *Attorney, Agent, or Firm*—Lisa K. Jorgenson; Allen, Dyer, Doppelt, Milbrath & Gilchrist, P.A.

(57) ABSTRACT

A semiconductor device includes a semiconductor substrate, a photon avalanche detector in the semiconductor substrate. The photon avalanche detector includes an anode of a first conductivity type and a cathode of a second conductivity type. A guard ring is in the semiconductor substrate and at least partially surrounds the photon avalanche detector. A passivation layer of the first conductivity type is in contact with the guard ring to reduce an electric field at an edge of the photon avalanche detector.

15 Claims, 6 Drawing Sheets

OTHER PUBLICATIONS

Cohen, M et al, *Fully Optimized Cu Based Process with Dedicated Cavity Etch for 1.75μm and 1.45μm Pixel Pitch CMOS Image Sensors:*.

Cova, Sergio et al, *A Semiconductor Detector for Measuring Ultra weak Flourescence Decays with 70 ps. FWHM Resolution*: IEEE Journal of Quatum Electronics, vol. QE-19, No. 4, Apr. 1983; pp. 630-634.

Niclass, Christiana et al, *Toward a 3-D Camera Based on Single Photon Avalanche Diodes*: IEEE Journal of Selected Topics in Quatum Electronics, vol. 10, No. 4, Jul./Aug. 2004; pp. 796-802.

Rochas, A. et al, *Single Photon Detector Fabricated in a Complementary Metal-Oxide-Semiconductor High-voltage Technology*: Review of Scientific Instruments, vol. 74, No. 7, Jul. 2003, pp. 3263-3270.

Gersbach, Marek et al, *A Single Photon Detector implemented in a 130nm CMOS imaging Process*: ESSDERC Conference, Edinburgh, Sep. 2008.

Niclass, Cristiano et al, *a 130nm Single Photon Avalanche Diode*, IEEE Journal of Selected Topics in Quantum Electronics, vol. 13, Issue 4, Jul.-Aug. 2007, pp. 863-869.

\* cited by examiner

SINGLE PHOTON DETECTOR AND ASSOCIATED METHODS FOR MAKING THE SAME

FIELD OF THE INVENTION

The present invention relates to single photon detectors, and in particular, to a single photon avalanche diode (SPAD) fabricated in a CMOS imaging process.

BACKGROUND OF THE INVENTION

Since early implementations of SPADs and CMOS-based SPADS, these devices have established themselves as the detectors of choice in multiple time-correlated imaging methods, such as fluorescence lifetime imaging and 3D imaging. For SPADS reference is directed to S. Cova et al., "A Semiconductor Detector for Measuring Ultraweak Fluorescence Decays with 70 ps FWHM Resolution," IEEE Journal of Quantum Electronics, vol. 10(4), pp. 630-634, 1983; and for CMOS-based SPADs reference is directed to Rochas et al., "Single Photon Detector Fabricated in a Complementary Metal-Oxide-Semiconductor High-Voltage Technology," Review of Scientific Instruments, vol. 74(7), pp. 3263-3270, 2003. One of the major challenges still remaining is the formation of a large array of SPADs. This implies the reduction of pitch and increased scalability of detectors.

In addition, to reach picosecond time resolutions it is generally commonplace to perform time discrimination off-chip. With thousands or millions of single photon detectors, the bottleneck becomes readout, unless timing electronics are integrated on-chip. Reference is directed to C. Niclass et al., "Towards a 3D Camera Based on Single Photon Avalanche Diodes," IEEE Journal of Selected Topics in Quantum Electronics, 10(4), 796-802, 2004. To allow for sufficient electronics to be integrated on a pixel or array level, the approach is either designing SPADs in deep-submicron CMOS technology or using 3D packaging technology.

The core of the SPAD includes a p-n junction biased above its breakdown voltage, thus operating in the Geiger mode. In this region of operation, free carriers such as photo generated electron hole pairs, can trigger an avalanche breakdown by impact ionization. To avoid premature edge breakdown a guard ring has been implemented to limit the electric field at the edges of the junction.

As disclosed in Cohen et al., "Fully Optimized Cu Based Process with Dedicated Cavity Etch for 1.75 μm and 145 μm Pixel Pitch CMOS Image Sensors," IEDM, 2006, the use of shallow trench isolation (STI) as a guard ring yields a significant improvement in fill-factor. However, it is well known that STI dramatically increases the density of deep-level carrier generation centers at its interface. Thus, if the active region of the SPAD is in direct contact with the STI as in Finkelstein et al. "STI-Bounded Single-Photon Avalanche Diode in a Deep-Submicrometer CMOS Technology," IEEE Electron Device Letters, vol. 27 (11), pp. 887-889, 2006, the injection of free carriers into the sensitive region of the detector results in a very high count rate, known as the dark count rate (DCR), which is unrelated to photo-detection events.

SUMMARY OF THE INVENTION

In view of the foregoing background, an object of the present invention is to reduce the dark count rate (DCR) in a single photon avalanche detector (SPAD) bounded by a shallow trench isolation (STI), while maintaining a high-density in STI-based implementations.

This and other objects, advantages and features in accordance with the present invention are provided by a semiconductor device including a semiconductor substrate, and a photon avalanche detector in the semiconductor substrate. The photon avalanche detector may include an anode of a first conductivity type, and a cathode of a second conductivity type. A guard ring may be in the semiconductor substrate and at least partially surrounds the photon avalanche detector. A passivation layer of the first conductivity type may be in contact with the guard ring to reduce an electric field at an edge of the photon avalanche detector. The semiconductor device may be configured as an imaging device, for example.

The passivation layer advantageously reduces the electric field at an edge of the photon avalanche detector. The guard ring may include a pair of spaced apart side walls and a bottom surface therebetween, and the passivation layer may be formed so that it is only on the sidewall closest to the photon avalanche detector and on the bottom surface of the guard ring.

The guard ring may completely surround the photon avalanche detector. The guard ring may be configured as a shallow trench isolation (STI) structure. The photon avalanche detector and the guard ring may be circular shaped.

The semiconductor device may further comprise a resistance coupled to the anode of the photon avalanche detector, and a comparator coupled to the anode of the photon avalanche detector. The resistance is know as a quenching resistance and the comparator is part of the read-out electronics that may be integrated in the same semiconductor substrate as the photon avalanche detector. The quenching resistance and the read-out electronics may be in close vicinity to the photon avalanche detector. This limits the parasitic capacitances at the borders of the detector, thus limiting the charges flowing through the detector and decreasing the probability of afterpulses occurring.

The first conductivity type may be a p-type conductivity, and the second conductivity type may be an n-type conductivity. Alternatively, the first conductivity type may be an n-type conductivity, and the second conductivity type may be a p-type conductivity. In the accompanying figures references to p-type and n-type conductivities can be reversed.

The term circular may be interpreted to mean a form that is as close to circular as will be permitted by the given manufacturing process and design rules. It will be appreciated by those skilled in the art that a perfect circle may not possible, and that there will be an element of quantization around the perimeter.

The semiconductor device may be implemented in a 130 nm deep submicron CMOS imaging process. The passivation layer may be formed from a number of implants of the first conductivity type.

Another aspect is directed to a method for reducing the dark count rate (DCR) by a photon avalanche detector as described above. The method may comprise forming a guard ring in the semiconductor substrate so that the guard ring at least partially surrounds the photon avalanche detector, and forming a passivation layer of the first conductivity type in contact with the guard ring to reduce the dark count rate by the photon avalanche detector.

BRIEF DESCRIPTION OF THE DRAWINGS

The present invention will now be described, by way of example, with reference to the accompanying drawings, in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
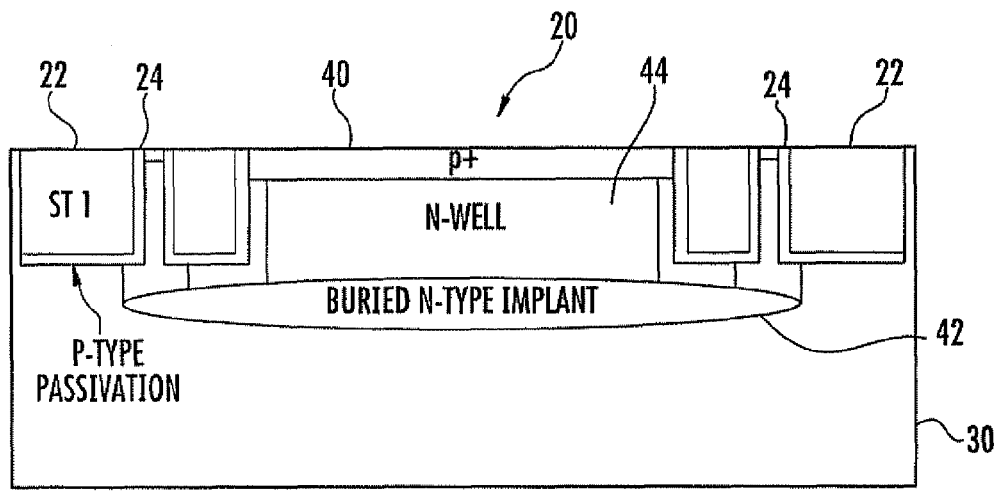
FIG. 1 shows a cross-sectional view of a circular STI-bounded SPAD (not to scale) in accordance with the present invention. The STI-interface has been passivated using multiple p-type implants, thus reducing the probability of minority carriers entering the multiplication region of the detector and triggering dark counts.
Figure 2:
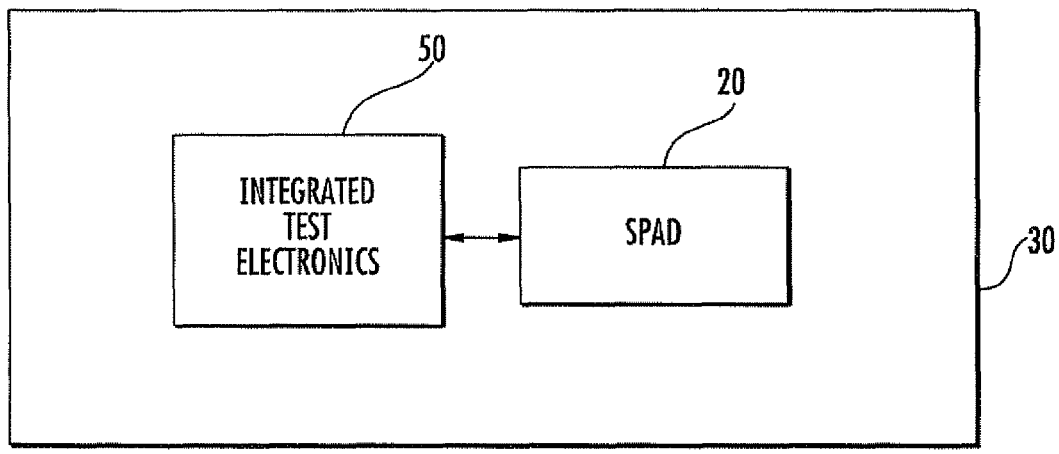
FIG. 2 is a plan view of the SPAD of FIG. 1 and the integrated test electronics implemented in 130 nm CMOS technology.

Referring initially to FIGS. 1 and 2, a technique to reduce the dark count rate (DCR) in an imaging device including an STI-bounded SPAD 20, while maintaining a high-density for STI-based implementations, will now be discussed. In the illustrated embodiment, an STI region 22 is surrounded by one or more passivation implants 24 in order to create a glove-like p-type structure surrounding the STI region. At the STI interface the doping level is high. This results in a very short mean free path of the minority carriers. This has the effect of drastically reducing the probability of these carriers entering the active region of the SPAD 20.

Because of design constraints, SPADs 20 for deep-submicron technologies usually have an octagonal shape as disclosed in Finkelstein et al., "STI-Bounded Single-Photon Avalanche Diode in a Deep-Submicrometer CMOS Technology," IEEE Electron Device Letters, vol. 27 (11), pp. 887-889, 2006; and Niclass et al., "A Single Photon Avalanche Diode Implementation in 130-nm CMOS Technology," IEEE Journal of Selected Topics in Quantum Electronics, vol. 13, pp. 863-869, 2007. At the edges of the octagonal structures the electric field is significantly higher than in the rest of the multiplication region, thus creating regions of high noise contribution. To ensure a uniform electric field distribution across the entire p-n junction, a circular geometry has been implemented for the illustrated SPAD 20. A schematic representation of the SPAD 20 is illustrated in FIG. 1, and a plan view of the detector 20 with integrated electronics 30 associated therewith is shown in FIG. 2.

The photon avalanche detector 20 is formed in a semiconductor substrate 30, and includes an anode 40 of a first conductivity type and a cathode 42 of a second conductivity type. The cathode 42 is a buried n-type implant that allows for an ohmic or resistive contact to the n-well 44 to be made. As illustrated in FIG. 1, the first conductivity type is a p-type conductivity, and the second conductivity type is an n-type conductivity. Alternatively, the first conductivity type may be an n-type conductivity, and the second conductivity type may be a p-type conductivity.

Figure 3:
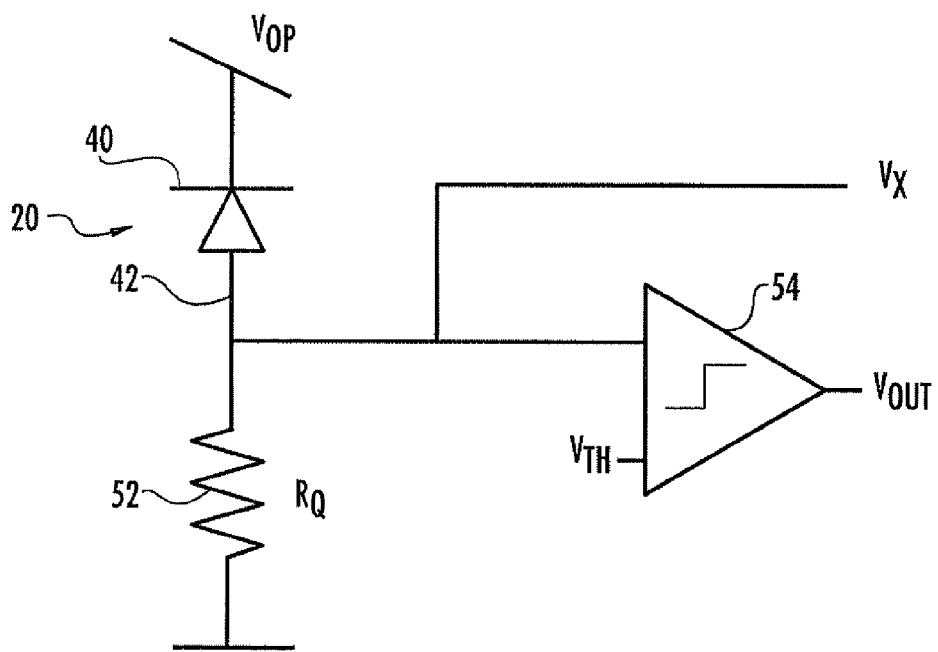
FIG. 3 is a schematic diagram of the SPAD of FIG. 1 and the integrated testing electronics. The passive quenching circuit is configured as a ballast resistor, and recharge is achieved passively through this circuit. Threshold detection and impedance conversion is implemented via the comparator.

In one embodiment, the SPAD 20 can be integrated along with an on-chip ballast resistance 52 and a comparator 54, as best illustrated in FIG. 3. The ballast resistance 52 is used to perform passive quenching and recharge of the diode 20 when operating in the Geiger mode. Voltage $V_{OP}$ satisfies the equation $V_{OP}=V_e+|-V_{BD}|$, where $V_e$ is the excess bias voltage and $V_{BD}$ is the breakdown voltage.

When an avalanche breakdown is triggered, the avalanche current flowing through the ballast resistor 52 decreases the voltage across the diode 20. When the voltage reaches the breakdown voltage, the avalanche current is no longer sustained and dies out. The SPAD 20 is then passively recharged by a small current flowing through the ballast resistor 52. The comparator 54, with a proper threshold voltage $V_{th}$, is used to convert the Geiger pulses into digital signals.

Figure 4:
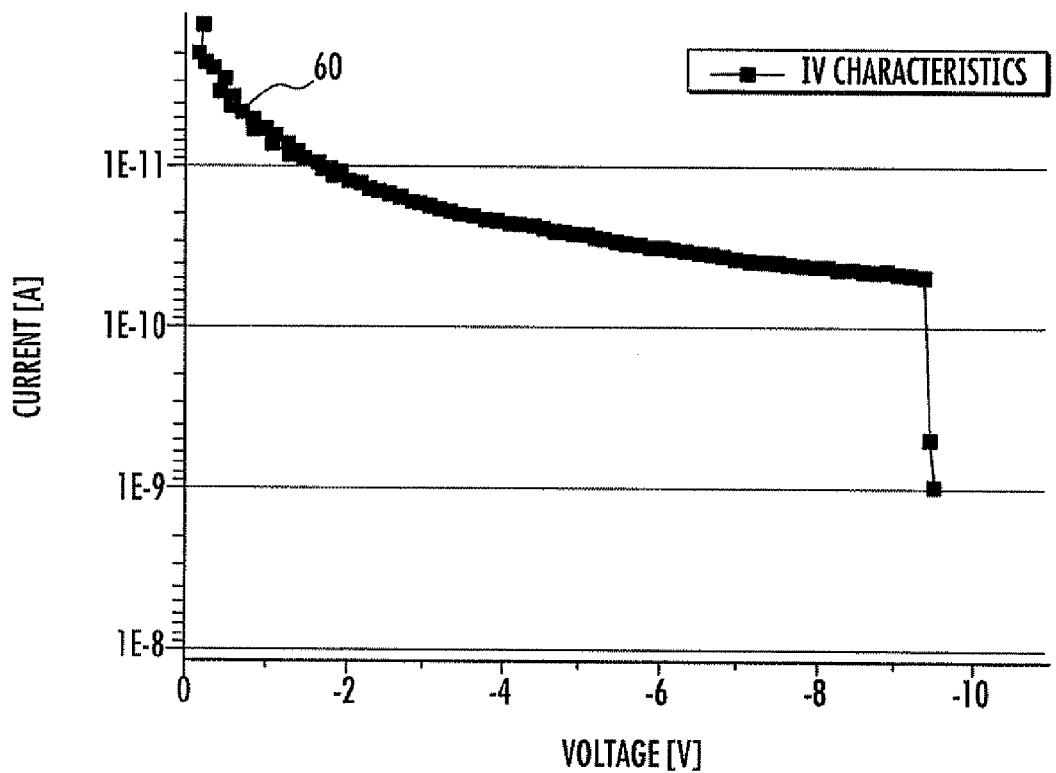
FIG. 4 shows the I-V characteristics of the SPAD of FIG. 1.

For a p-n junction to work well in the Geiger mode it needs to exhibit a low dark current and an abrupt breakdown behavior. The I-V characteristic for the illustrated detector 20 was measured statically using a standard semiconductor analyzer. FIG. 4 shows a plot 60 in which the dark current is $5 \times 10^{-11}$ A at the breakdown voltage of −9.4 V.

The guard ring structure 22 and the implementation of a round or circular SPAD 20 allows for a significant reduction of the DCR from approximately 1 MHz as in Finkelstein et al., "STI-Bounded Single-Photon Avalanche Diode in a Deep-Submicrometer CMOS Technology," IEEE Electron Device Letters, vol. 27 (11), pp. 887-889, 2006, to about 90 kHz at room temperature and at 1 volt of excess bias, while increasing the active area of the SPAD 20. While the DCR is similar to the device as in Niclass et al., "A Single Photon Avalanche Diode Implementation in 130-nm CMOS Technology," IEEE Journal of Selected Topics in Quantum Electronics, vol. 13, pp. 863-869, 2007, the STI-based guard ring structure 22 allows for a significant improvement in the fill-factor shown as in the above-referenced Finkelstein et al. article.

Figure 5:
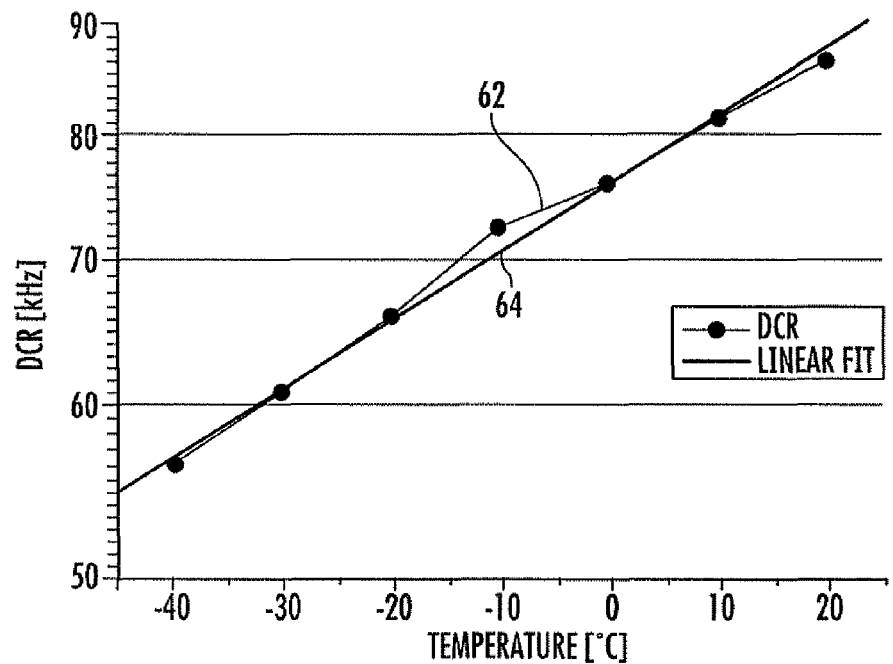
FIG. 5 is a plot showing the dark count rate of the SPAD of FIG. 1 as a function of temperature at IV of excess bias voltage. The slope of the curve indicates that tunneling is the dominant noise source.
Figure 6:
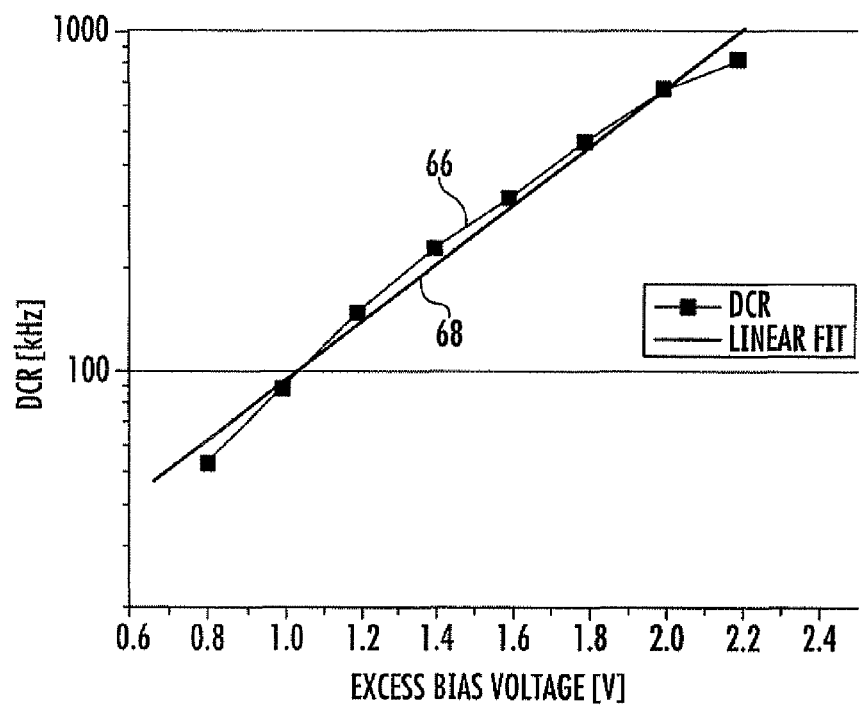
FIG. 6 is a plot showing the dark count rate at room temperature as a function of the excess bias voltage in accordance with the present invention.

When compared to older technologies, the use of advanced CMOS technologies implies higher doping levels as well as reduced annealing and drive-in diffusion steps. These factors contribute heavily to the noise floor measured in deep submicron SPADs 20. FIG. 5 provides plots 62, 64 showing the temperature dependence of the DCR. The slopes indicate that due to the high doping levels, tunneling-induced dark counts are the dominating noise source over trap-assisted thermal generation. FIG. 6 provides plots 66, 68 showing the dark count rate at room temperature as a function of the excess bias voltage.

To prove the effectiveness of the guard ring 22 and the consistency of the electric field across the active region of our detector 20, an optical measurement of the photons emitted during avalanche breakdown was undertaken. The emission of photons during avalanche breakdown is directly proportional to the current intensity, and thus to the electric field. During a period of 16 s a continuous avalanche current, limited to 100 μA, was allowed to flow through the diode 20. Photoemission was captured using a microscope and a standard CCD camera.

Figure 7A:
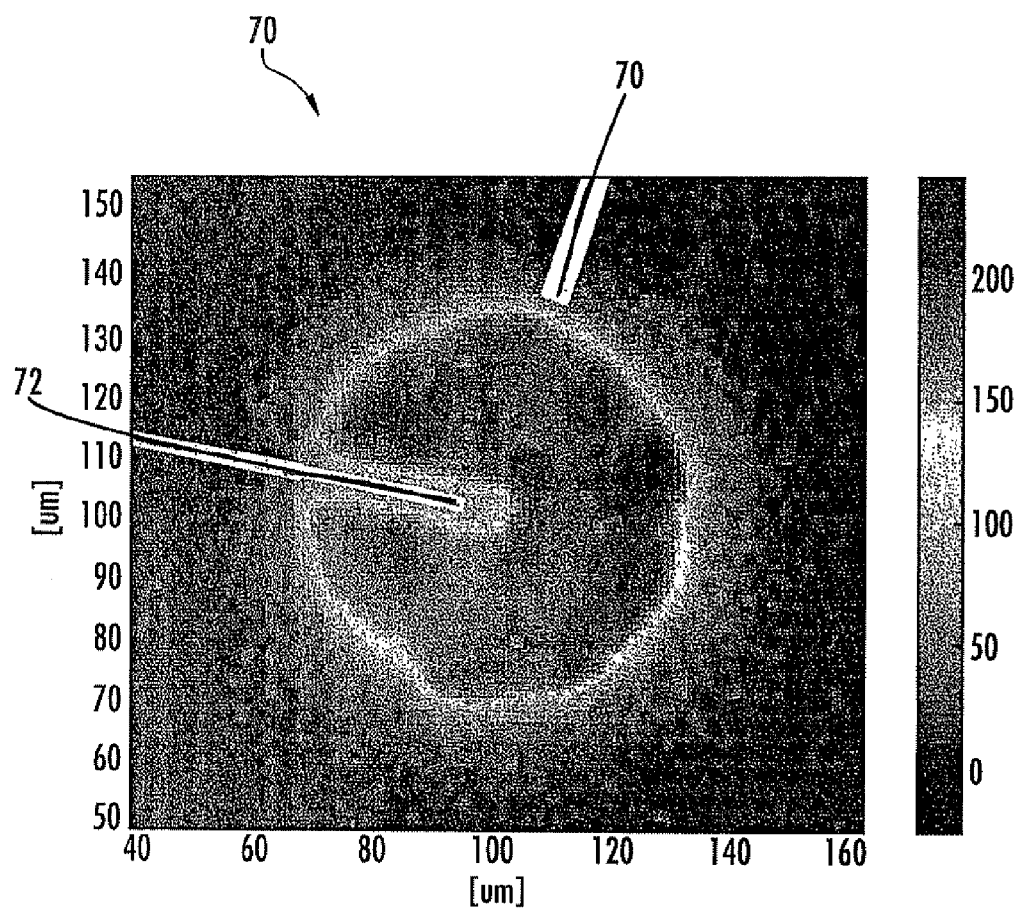
FIGS. 7A and 7B respectively show a measurement of the photoemission intensity (arbitrary scale) across the SPAD during avalanche breakdown in accordance with the present invention. Uniform emission indicates equal probability of breakdown on the active area.
Figure 7B:
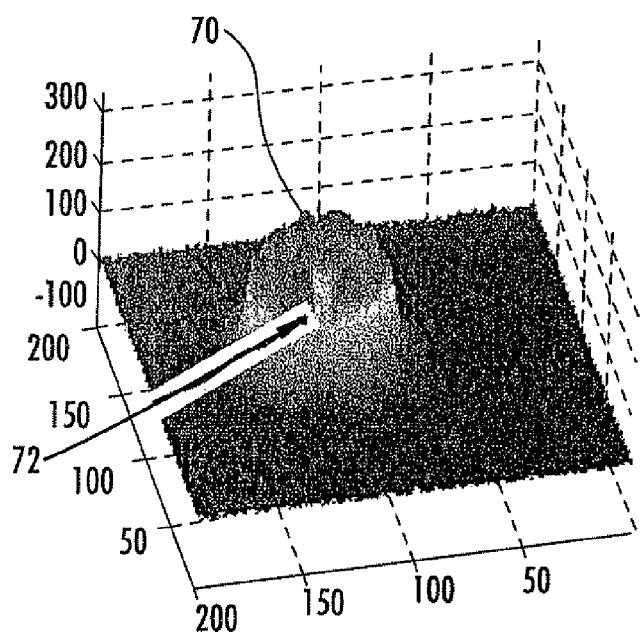

The photoemission 70 shown in FIGS. 7a and 7b indicates that the electric field is distributed homogeneously or evenly across the sensitive region of the SPAD 20. Furthermore, the absence of significant emission peaks at the border of the active region shows that the guard ring 22 is effective in lowering the electric field at the borders of the detector 20. The region with low emission intensity going to the center 72 of the detector 20 was shielded by a metal line connecting the center of the p+ implant.

Figure 8:
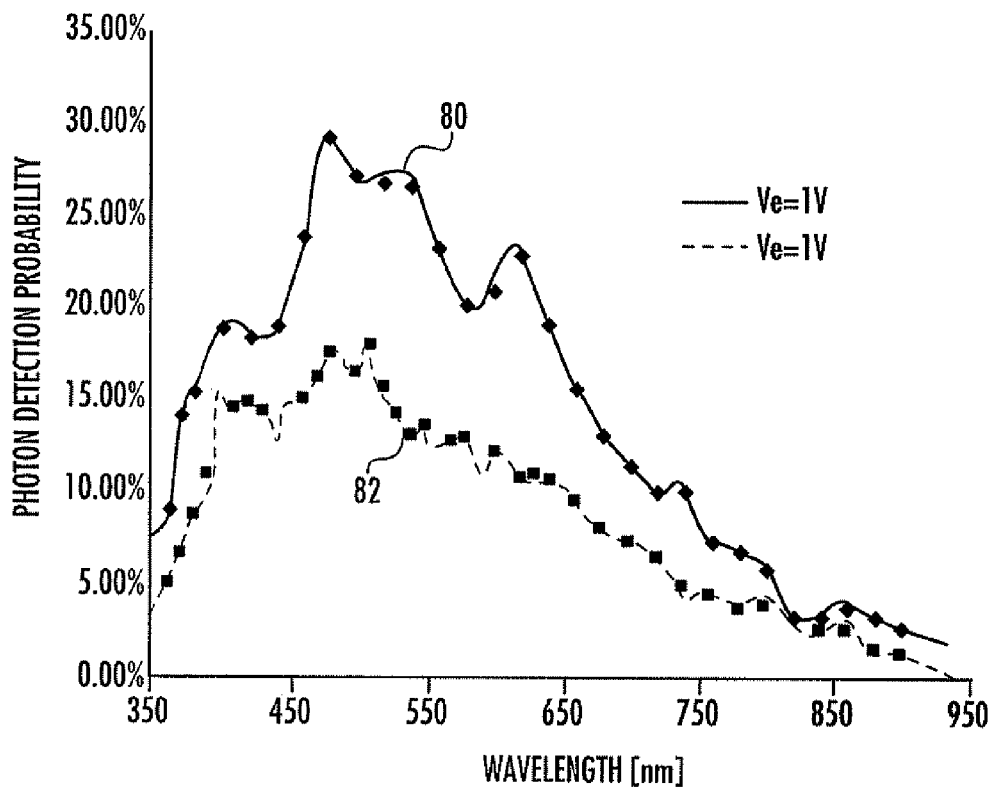
FIG. 8 is a graph showing photon detection probability for two different excess bias voltages in accordance with the present invention.

The sensitivity of the SPAD 20 over a wide spectral range has also been investigated. The use of an imaging CMOS process gives access to an optimized optical stack, and thus allows for a good photon detection probability (PDP). The measured PDP peaks at 30% at 480 nm of wavelength for an excess bias voltage of 2 V is indicated by line 80 in FIG. 8. The corresponding measurements for an excess bias voltage of 1 V is indicated by line 82.

As a comparison, the SPAD 20 fabricated in standard 0.18 μm technology in Faramarzpour et al., "Fully Integrated Single Photon Avalanche Diode Detector in Standard CMOS 0.18 μm Technology," IEEE Transactions on Electron Devices," vol. 55 (3), pp. 760-767, 2008 achieved a maximum PDP of only 5.5% at 2 V of excess bias. These measurements were obtained using a standard monochromator system coupled to an integrating sphere (LOT Oriel Group Europa) and a calibration detector (Hamatsu).

Figure 9:
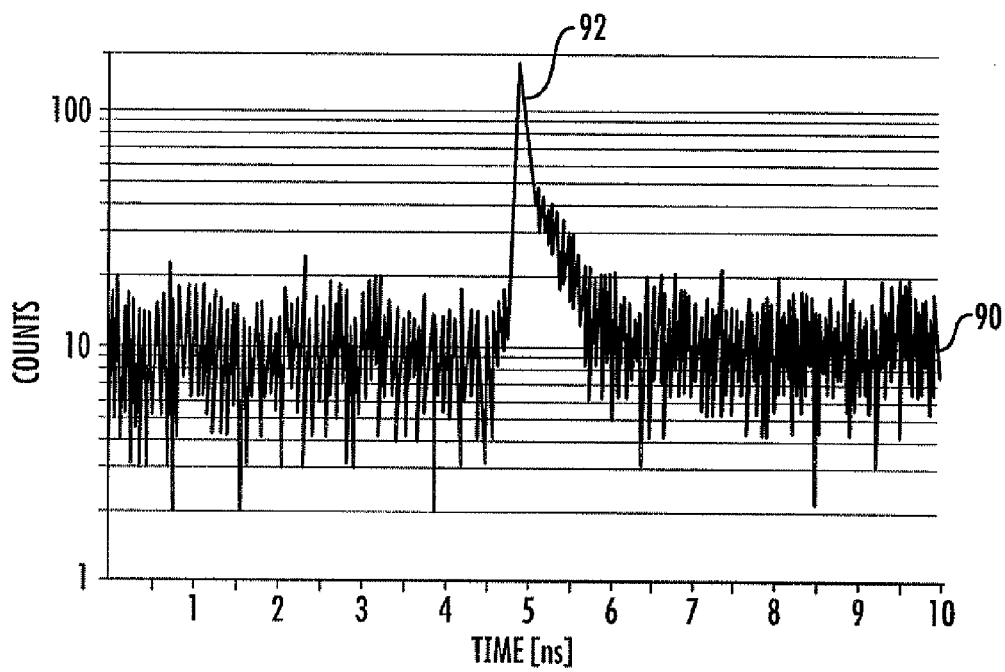
FIG. 9 is a graph showing the time response of the SPAD of FIG. 1 when illuminated by a picosecond light source at 637 nm wavelength and 1 V of excess bias voltage.

Another important measure for time-correlated applications is the time response of the detector 20. To assess its time-resolution, the SPAD 20 was illuminated by a picosecond laser diode source with a 637 nm wavelength (Advanced Laser Diode Systems GmBH, Berlin, Germany). At 1 V of excess bias voltage, the timing jitter at full-width-half-maximum was measured to be 125 ps. As can be seen from the right-hand side of the measured time response 90 in FIG. 9, the absorption of photons underneath the active region of the SPAD 20 creates a tail 92 in the time response as the generated free carriers may diffuse back into the multiplication region.

During an avalanche breakdown event, a significant amount of charge carriers flow through the diode 20. Some of these carriers may be trapped in the multiplication region of the diode 20 and subsequently released, thus triggering a second avalanche breakdown. To limit the probability of such after-pulses from occurring, it is necessary to limit the charges flowing through the diode 20. This can be done by limiting the capacitance at the borders of the diode 20.

In the illustrated embodiment, the use of a CMOS process allows the integration of the quenching resistance 52 and the read-out electronics 54 on-chip at the immediate surroundings of the detector 20, thus limiting the parasitic capacitances. To assess the after-pulsing probability, the correlation between subsequent breakdown events was measured.

Figure 10:
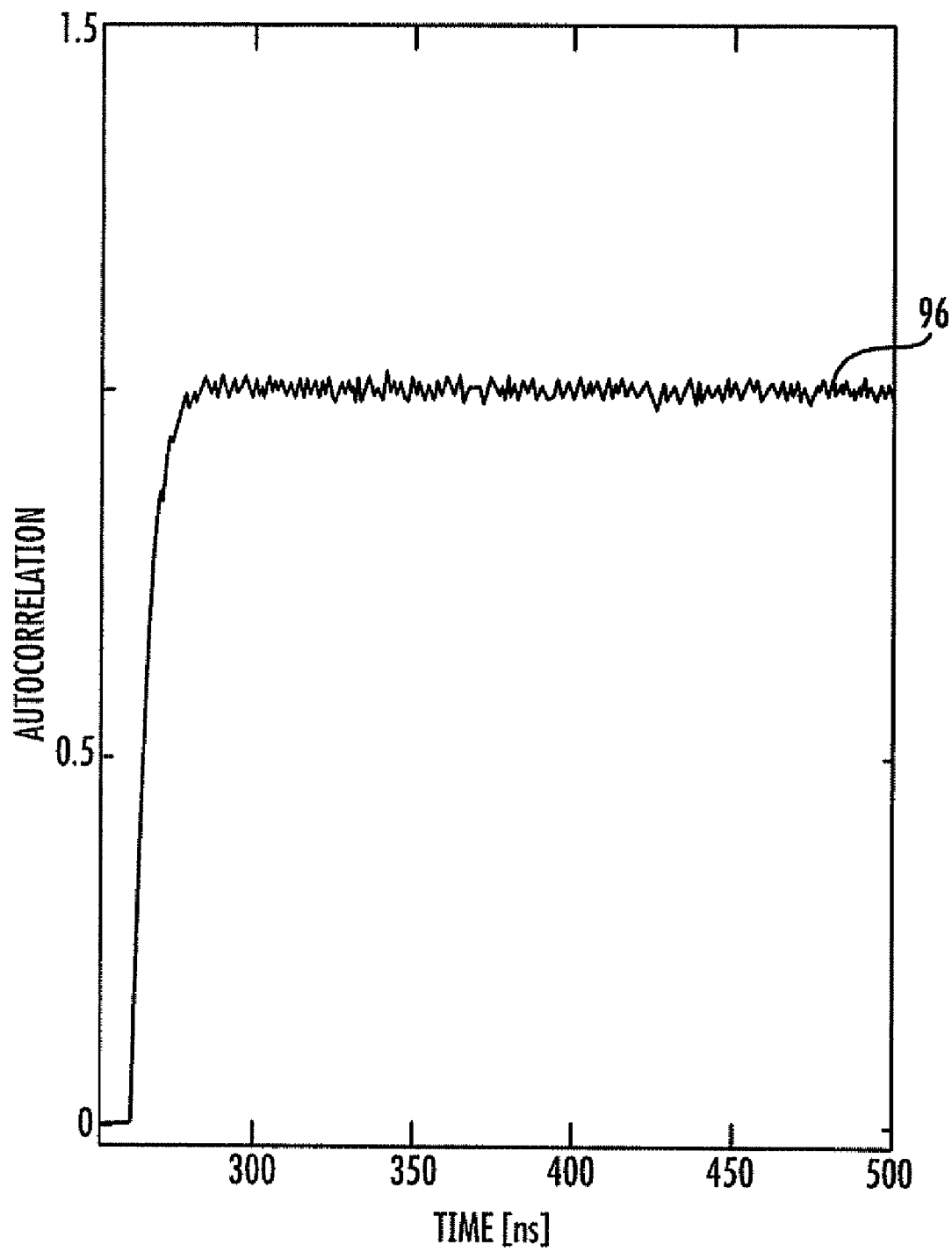
FIG. 10 shows an autocorrelation probability of the SPAD of FIG. 1. No after-pulsing contribution could be measured.

FIG. 10 shows the autocorrelation curve 96 obtained. Note that after each breakdown event the SPAD 20 needed to recharge, and is thus inactive for a certain amount time. This period of time is known as the dead time. For the illustrated structure the dead time is approximately 18 ns. Therefore, in approximately the first 18 ns after a breakdown event, the autocorrelation is zero. When the SPAD 20 is fully recharged the autocorrelation is stable around one, this proving that no after-pulsing is present.

Performance of the illustrated detector 20 at room temperature is summarized in TABLE 1.

TABLE 1

| | Performance | | | |
|---|---|---|---|---|
| | Min. | Typ. | Max. | Unit |
| PDP@$V_e$ = 1 V | | | 18 | % |
| PDP@$V_e$ = 2 V | | | 30 | % |
| DCR@$V_e$ = 1 V | | 90 | | kHz |
| Active Area | | 58 | | μm² |
| FWHM Time jitter @$V_e$ = 1 V | | 125 | | ps |
| After-Pulsing Probability | | <0.01 | | % |
| Dead Time | | 18 | | ns |
| Breakdown Voltage | | 9.4 | | V |

The illustrated SPAD 20 combines the advantages of deep-submicron processes, such as the possibility of integrating complex electronics and the improved fill-factor due to the STI-based guard ring 22. This is while improving the noise performance of more than an order of magnitude when compared to comparable STI-bounded SPADs. The first integration of the illustrated SPADs 20 along with quenching 52 and read-out electronics 54 in 130 nm CMOS technology showed that no after-pulsing is present even with a dead time as short as 18 ns. Finally, optical measurements of the photoemission during avalanche breakdown proved the effectiveness of the guard ring structure 22 and the planarity or consistency of the multiplication region.

Another aspect is directed to a method for reducing the dark count rate (DCR) by a photon avalanche detector 20 as described above. The method comprises forming a guard ring 22 in the semiconductor substrate 30 that at least partially surrounds the photon avalanche detector, and forming a passivation layer 24 of the first conductivity type in contact with the guard ring 22 to reduce the dark count rate by the photon avalanche detector 20.

The illustrated structure combines shallow trench isolation (STI) and a passivation implant, thus creating an effective guard ring 22 against premature edge breakdown. As a result of the guard ring 22, high levels of miniaturization may be reached without detriment to noise, sensitivity and timing resolution. As discussed above, optical measurements show the effectiveness of the guard ring 22 and the high degree of electric field planarity or consistency across the sensitive region of the detector 20. With a photon detection probability of up to 30% and a timing jitter of 125 ps at full-width-half-maximum, the SPAD 20 is well suited for applications such as 3-D imaging, fluorescence lifetime imaging, and biophotonics.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A semiconductor device comprising:
   a semiconductor substrate;
   a photon avalanche detector in said semiconductor substrate, and comprising an anode of a first conductivity type and a cathode of a second conductivity type;
   a guard ring in said semiconductor substrate and at least partially surrounding said photon avalanche detector; and a passivation layer of the first conductivity type in contact with said guard ring to reduce a dark count rate (DCR) by said photon avalanche detector.

2. Thee semiconductor device according to claim 1 wherein said guard ring completely surrounds said photon avalanche detector.

3. Thee semiconductor device according to claim 1 wherein said guard ring is configured as a shallow trench isolation (STI) structure.

4. The semiconductor device according to claim 1 wherein said photon avalanche detector and said guard ring are circular shaped.

5. The semiconductor device according to claim 1 wherein said guard ring includes a pair of spaced apart side walls and a bottom surface therebetween; and wherein said passivation layer is only on the sidewall closest to said photon avalanche detector and on the bottom surface of said guard ring.

6. The semiconductor device according to claim 1 further comprising:
   a resistance coupled to the anode of said photon avalanche detector; and
   a comparator coupled to the anode of said photon avalanche detector.

7. The semiconductor device according to claim 1 wherein the first type of conductivity comprises a p-type conductivity, and the second type of conductivity comprises an n-type conductivity.

8. The semiconductor device according to claim 1 wherein the first type of conductivity comprises an n-type conductivity, and the second type of conductivity comprises a p-type conductivity.

9. An imaging device comprising:
   a semiconductor substrate;
   at least one photon avalanche detector in said semiconductor substrate, and comprising an anode of a first conductivity type and a cathode of a second conductivity type, said at least one photon avalanche detector being circular shaped;
   at least one guard ring in said semiconductor substrate and at least partially surrounding said at least one photon avalanche detector, said at least one guard ring being circular shaped; and
   at least one passivation layer of the first conductivity type in contact with said at least one guard ring.

10. The imaging device according to claim 9 wherein said at least one guard ring completely surrounds said at least one photon avalanche detector.

11. The imaging device according to claim 9 wherein said at least one guard ring is configured as a shallow trench isolation (STI) structure.

12. The imaging device according to claim 9 wherein said guard ring includes a pair of spaced apart side walls and a bottom surface therebetween; and wherein said passivation layer is only on the sidewall closest to said photon avalanche detector and on the bottom surface of said guard ring.

13. The imaging device according to claim 9 further comprising:
   a resistance in said semiconductor substrate and coupled to the anode of said at least one photon avalanche detector; and
   a comparator in said semiconductor substrate and coupled to the anode of said at least one photon avalanche detector.

14. The imaging device according to claim 9 wherein the first type of conductivity comprises a p-type conductivity, and the second type of conductivity comprises an n-type conductivity.

15. The imaging device according to claim 9 wherein the first type of conductivity comprises an n-type conductivity, and the second type of conductivity comprises a p-type conductivity.

* * * * *

UNITED STATES PATENT AND TRADEMARK OFFICE
CERTIFICATE OF CORRECTION

| | | |
|---|---|---|
| PATENT NO. | : 7,898,001 B2 | Page 1 of 1 |
| APPLICATION NO. | : 12/327240 | |
| DATED | : March 1, 2011 | |
| INVENTOR(S) | : Richardson et al. | |

It is certified that error appears in the above-identified patent and that said Letters Patent is hereby corrected as shown below:

Column 7, Line 4            Delete: "Thee"
Insert: --The--

Column 7, Line 7            Delete: "Thee"
Insert: --The--

Signed and Sealed this
Sixteenth Day of August, 2011

David J. Kappos
*Director of the United States Patent and Trademark Office*